United States Patent
Han et al.

(10) Patent No.: US 9,293,617 B2
(45) Date of Patent: Mar. 22, 2016

(54) COPOLYMER OF PHASE CHANGE MATERIAL FOR THERMAL MANAGEMENT OF PV MODULES

(71) Applicant: Honeywell International Inc., Morristown, NJ (US)

(72) Inventors: Jeffrey Han, Shanghai (CN); Wei Jun Wang, Shanghai (CN); Hongsheng Zhang, Shanghai (CN); Neo Huang, Shanghai (CN)

(73) Assignee: HONEYWELL INTERNATIONAL INC., Morris Plains, NJ (US)

( * ) Notice: Subject to any disclaimer, the term of this patent is extended or adjusted under 35 U.S.C. 154(b) by 48 days.

(21) Appl. No.: 14/095,797

(22) Filed: Dec. 3, 2013

(65) Prior Publication Data

US 2014/0163176 A1 Jun. 12, 2014

Related U.S. Application Data

(60) Provisional application No. 61/735,413, filed on Dec. 10, 2012.

(51) Int. Cl.
| | |
|---|---|
| C08F 210/02 | (2006.01) |
| H01L 31/048 | (2014.01) |
| H01L 31/049 | (2014.01) |
| H02S 40/42 | (2014.01) |
| C08F 20/32 | (2006.01) |
| C08F 220/32 | (2006.01) |

(52) U.S. Cl.
CPC .......... *H01L 31/0487* (2013.01); *C08F 210/02* (2013.01); *H01L 31/049* (2014.12); *H02S 40/42* (2014.12); *C08F 20/32* (2013.01); *C08F 2220/325* (2013.01); *Y02E 10/50* (2013.01)

(58) Field of Classification Search
None
See application file for complete search history.

(56) References Cited

U.S. PATENT DOCUMENTS

| | | | |
|---|---|---|---|
| 4,532,917 | A | 8/1985 | Taff et al. |
| 5,954,984 | A | 9/1999 | Ablah et al. |
| 7,750,072 | B2 | 7/2010 | Thompson-Colon et al. |
| 7,976,944 | B2 | 7/2011 | Hu et al. |
| 8,587,945 | B1 * | 11/2013 | Hartmann et al. ............ 361/708 |
| 2003/0124278 | A1 | 7/2003 | Clark et al. |
| 2008/0108751 | A1 | 5/2008 | Rogunova et al. |
| 2010/0016513 | A1 | 1/2010 | Hartmann et al. |
| 2010/0288333 | A1 | 11/2010 | Temchenko et al. |

FOREIGN PATENT DOCUMENTS

| | | | |
|---|---|---|---|
| CN | 1079420 | C | 3/2000 |
| CN | 1616588 | A | 5/2005 |
| CN | 1958711 | A | 5/2007 |
| CN | 101386683 | B | 3/2009 |
| CN | 102391441 | A | 3/2012 |
| DE | 10 2006 055 707 | A1 | 5/2008 |
| FR | 2866891 | * | 9/2005 |
| JP | 2003-26894 | A | 1/2003 |

OTHER PUBLICATIONS

Computer Translation of FR 2866891-2005.*
Balci, Polym. Bull. (2010) 64, p. 691-705.*
Chen, Solar Energy, 85 (2011) 2679-2685.*
Chen, et al. "Synthesis of solid-soli phase change material for thermal energy storage by crosslinking of polyethylene glycol with poly(glycidyl methacrylate)", Solar Energy, 2011 Vl 85 No. 11 pp. 2679-2685, Figs 1-7 and table 1.
Li, et al. "Cellulose-based solid-solid phase change materials synthesized in ionic liquid", Solar Energy Materials & Solar Cells, 2009, vol. 93, No. 8, pp. 1321-1328 ; scheme 1, tables 1 and 2, figs 4-10.
Li, Y. et al., "Synthesis and Phase Transition of Cellulose-grat-poly-(ethylene glycol) Copolymers," Journal of Applied Polymer Science, v.110, n.3, Nov. 2008, pp. 1797-1803.
Sari, A. et al., "Synthesis and Thermal Properties of Polystyrene-graft-PEG Copolymers as New Kinds of Solid-Solid Phase Change Materials for Thermal Energy Storage," Materials Chemistry and Physics, v.133, Mar. 2012, pp. 87-94.
Sari, A. et al., "Synthesis and Thermal Properties of Poly(styrene-co-ally alcohol)-graft-stearic Acid Copolymers as Novel Solid-Solid PCMs for Thermal Energy Storage," Solar Energy, v.86, 2012, pp. 2282-2292.
Sari, A. et al., "Synthesis and Thermal Energy Storage Characteristics of Polystyrene-graft-palmitic Acid Copolymers as Solid-Solid Phase Change Materials," Solar Energy Materials and Solar Cells, v.95, Dec. 2011, pp. 3195-3201.

* cited by examiner

*Primary Examiner* — Robert C Boyle
(74) *Attorney, Agent, or Firm* — Ingrassia Fisher & Lorenz, P.C.

(57) ABSTRACT

The present invention relates to phase change materials (PCMs) which may be used with photovoltaic (PV) modules. More specifically, solid/solid PCMs having a polyolefin backbone polymer and a crystallizable side chain are provided. Preferably, the solid/solid PCM has a copolymer backbone having a polyolefin repeating unit, and the crystallizable side chains are grafted onto the copolymer backbone. Most preferably, the copolymer is poly(ethylene-co-glycidyl methacrylate) (PE-co-GMA), and polyethylene glycol (PEG) is the crystallizable side chain. Photovoltaic modules and backsheets for photovoltaic modules having solid/solid PCMs are also provided.

5 Claims, 6 Drawing Sheets

COPOLYMER OF PHASE CHANGE MATERIAL FOR THERMAL MANAGEMENT OF PV MODULES

CROSS REFERENCE TO RELATED APPLICATION

The present application claims the benefit of U.S. Provisional Patent Application No. 61/735,413, filed on Dec. 10, 2012, the disclosure of which is incorporated herein by reference in its entirety.

FIELD OF THE INVENTION

The present invention relates to phase change materials (PCMs) which may be used with photovoltaic (PV) modules.

DESCRIPTION OF RELATED ART

At the present time, composites of fluoropolymers and poly(ethylene terephthalate) (PET) are commonly used for backsheets for photovoltaic modules. For example, a fluoropolymer layer on the outside provides weathering resistance, and the PET in the core layer provides dielectric insulation and mechanical strength. In addition, another layer of fluoropolymer on the other side of a core layer can provide bonding to an encapsulant material in the photovoltaic module, for example, an ethylene vinyl acrylate (EVA) encapsulant.

However, backsheets using fluoropolymers and PET have several drawbacks. First, PET is easily hydrolyzed, and as such, may fail in hot and/or humid conditions. Second, fluoropolymers such as PVF, PVDF or ETFE are difficult to process into films, are expensive, and are subject to constraints in raw material supply. Third, the use of different polymer layers requires an adhesive to bond them together, and this adhesive can potentially fail in long term outdoor use.

As such, a number of alternative backsheet compositions have been investigated for use with photovoltaic modules. For example, formulated thermoplastic polyolefin layers have been developed by Honeywell Corporation which adhere well to EVA encapsulated photovoltaic modules, yet, in contrast to existing technology, has favorable performance at high operating temperatures and do not have a high water vapor transmission rate. Examples of such layers may be found in U.S. Provisional Application 61/731,400 ("the '400 application") filed on Nov. 29, 2012, entitled "Photovoltaic Module Backsheet Having a Thermoplastic Polyolefin Composite Layer," which is incorporated herein by reference.

However, high temperatures in photovoltaic modules do not only affect the integrity of the materials therein—high temperatures also can affect the electricity production of the photovoltaic module. Investigations have confirmed that electricity yield of silicon photovoltaic cells sharply decreases as temperature increases. For example, as pointed out in United States Patent Application Publication No. 2010/0288333 A1 ("the '333 application"), as compared to a test temperature of 25° C., a crystalline silicon photovoltaic module is expected to perform 69% less efficient at a temperature of 64° C. The '333 application proposes the use of solid/liquid PCMs in photovoltaic module backsheets; however, similar to the problems addressed in the '400 application, such materials would have poor dimensional stability at high temperatures when the PCM was in liquid form.

BRIEF SUMMARY OF THE INVENTION

To address the above issues, solid/solid phase change materials (solid/solid PCMs) were investigated for use with photovoltaic modules. A solid/solid PCM is a material which, when used in a photovoltaic module, is capable of scavenging and storing excess heat by changing from crystalline to amorphous form. Solid/solid PCMs may be used or incorporated in various products and applications where temperature-regulation and thermal storage is desired. For example, a solid/solid PCM in accordance with the present invention could be processed into a film and incorporated into a photovoltaic module.

According to a first aspect of the present invention, a formulated solid/solid PCM having a polyolefin backbone polymer and a crystallizable side chain is provided. More specifically, the solid/solid PCM has a copolymer backbone having a polyolefin repeating unit, and the crystallizable side chains are grafted onto the copolymer backbone. Most specifically, the copolymer is poly(ethylene-co-glycidyl methacrylate) (PE-co-GMA), and polyethylene glycol (PEG) is the crystallizable side chain.

According to a second aspect of the present invention, a solid/solid PCM in accordance with the present invention experiences a phase change at a temperature of between about 25° C. and about 75° C. Even more preferably, the solid/solid PCM in accordance with the present invention experiences a phase change at a temperature of between about 35° C. and about 70° C. Most preferably, the solid/solid PCM in accordance with the present invention experiences a phase change at a temperature of between about 35° C. and about 60° C.

According to a third aspect of the present invention, a solid/solid PCM in accordance with the present invention has a latent heat of phase change of at least 40 kJ/kg. Even more preferably, a solid/solid PCM in accordance with the present invention has a latent heat of phase change of at least 50 kJ/kg.

According to a fourth aspect of the present invention, a method of preparing a PCM comprising grafting a crystallizable side chain onto a non-olefin unit of a polyolefin containing copolymer is provided. Preferably, the crystallizable side chain is PEG, and glycidyl methacrylate is the non-olefin unit.

According to a fifth aspect of the present invention, a backsheet comprising a solid/solid PCM which experiences a phase change at a temperature of between about 25° C. and about 75° C. is provided. Even more preferably, the solid/solid PCM in the backsheet experiences a phase change at a temperature of between about 35° C. and about 70° C. Most preferably, the solid/solid PCM in the backsheet experiences a phase change at a temperature of between about 35° C. and about 60° C.

According to a sixth aspect of the present invention, a photovoltaic module comprising a solid/solid PCM which experiences a phase change at a temperature of between about 25° C. and about 75° C. is provided. Even more preferably, the solid/solid PCM in the backsheet experiences a phase change at a temperature of between about 35° C. and about 70° C. Most preferably, the solid/solid PCM in the backsheet experiences a phase change at a temperature of between about 35° C. and about 60° C.

BRIEF DESCRIPTION OF THE DRAWINGS

Specific examples have been chosen for purposes of illustration and description, and are shown in the accompanying drawings, forming a part of the specification.

DETAILED DESCRIPTION

One example of solid/solid PCM copolymer which has been synthesized includes a backbone having a polyolefin repeating unit and PEG side chains. The skeleton polymer is poly(ethylene-co-glycidyl methacrylate) (PE-co-GMA). The reactive groups are the epoxide groups of the GMA unit. The crystallizable side chain is PEG containing hydroxyl groups. By the reaction between epoxide and hydroxyl groups, PEG units are grafted onto the skeleton polymer, then a PCM copolymer poly(ethylene-co-glycidyl methacrylate-graft-ethylene glycol) (PE-co-GMA-g-PEG) is obtained. The reaction scheme is shown below:

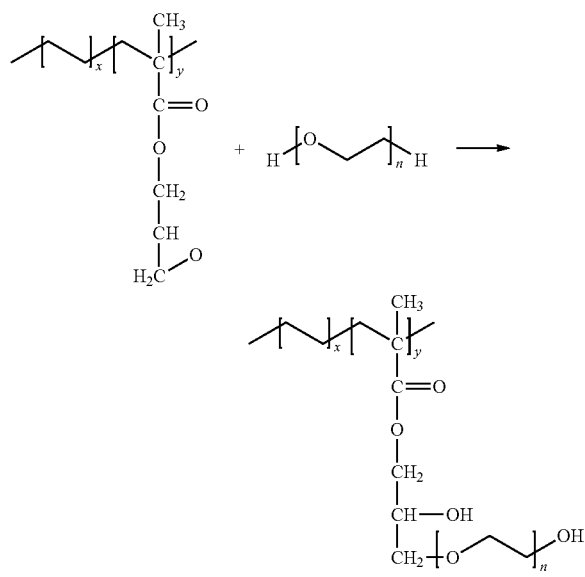

wherein x is a number of repeating groups in a polyethylene unit, y is a number of repeating groups for a glycidyl methacrylate unit, and n is the number of repeating groups in a PEG unit.

The process of synthesis of copolymer PE-co-GMA-g-PEG is as follows: 350 g PEG (MW=4000) was added into a flask equipped with stirrer, condenser, nitrogen purge, and temperature controller, then heated to 80° C. 30 g PE-co-GMA was dissolved into 1.5 L toluene. The solution of PE-co-GMA was added into the flask dropwise and temperature was kept at 80° C. for 6 hrs. After the solution cooled down, the solution of copolymer was separated from excessive PEG. Evaporating most of the solvent, the copolymer resin was obtained after being dried under 120° C. for 5 hrs.

The solid/solid PCM was tested using IR and H NMR spectroscopy, as well as with differential scanning calorimetry (DSC).

Figure 1A:
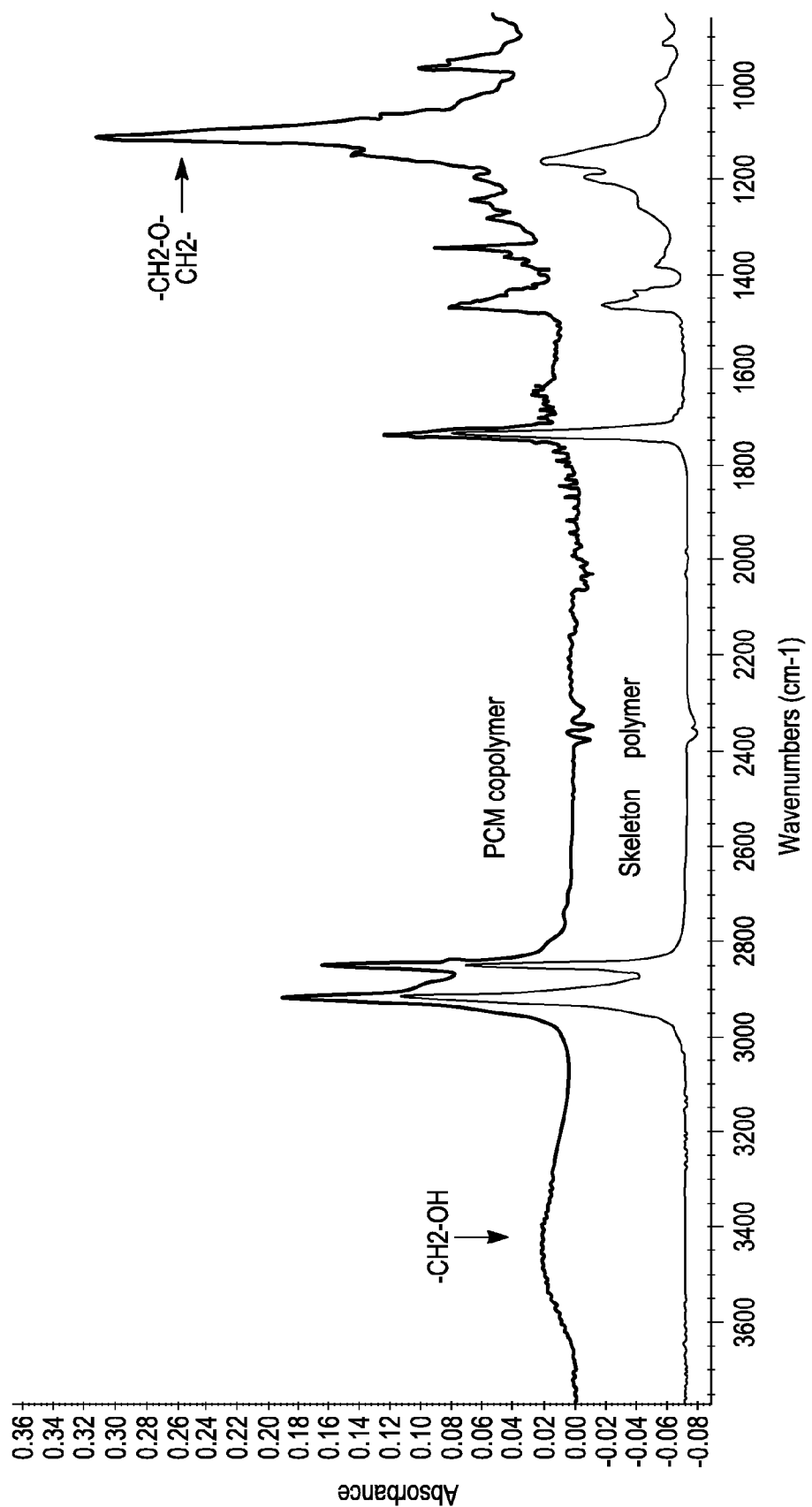
FIGS. 1A and 1B, respectively, illustrate IR and H NMR spectroscopic analysis of a solid/solid PCM of the present invention.
Figure 1B:
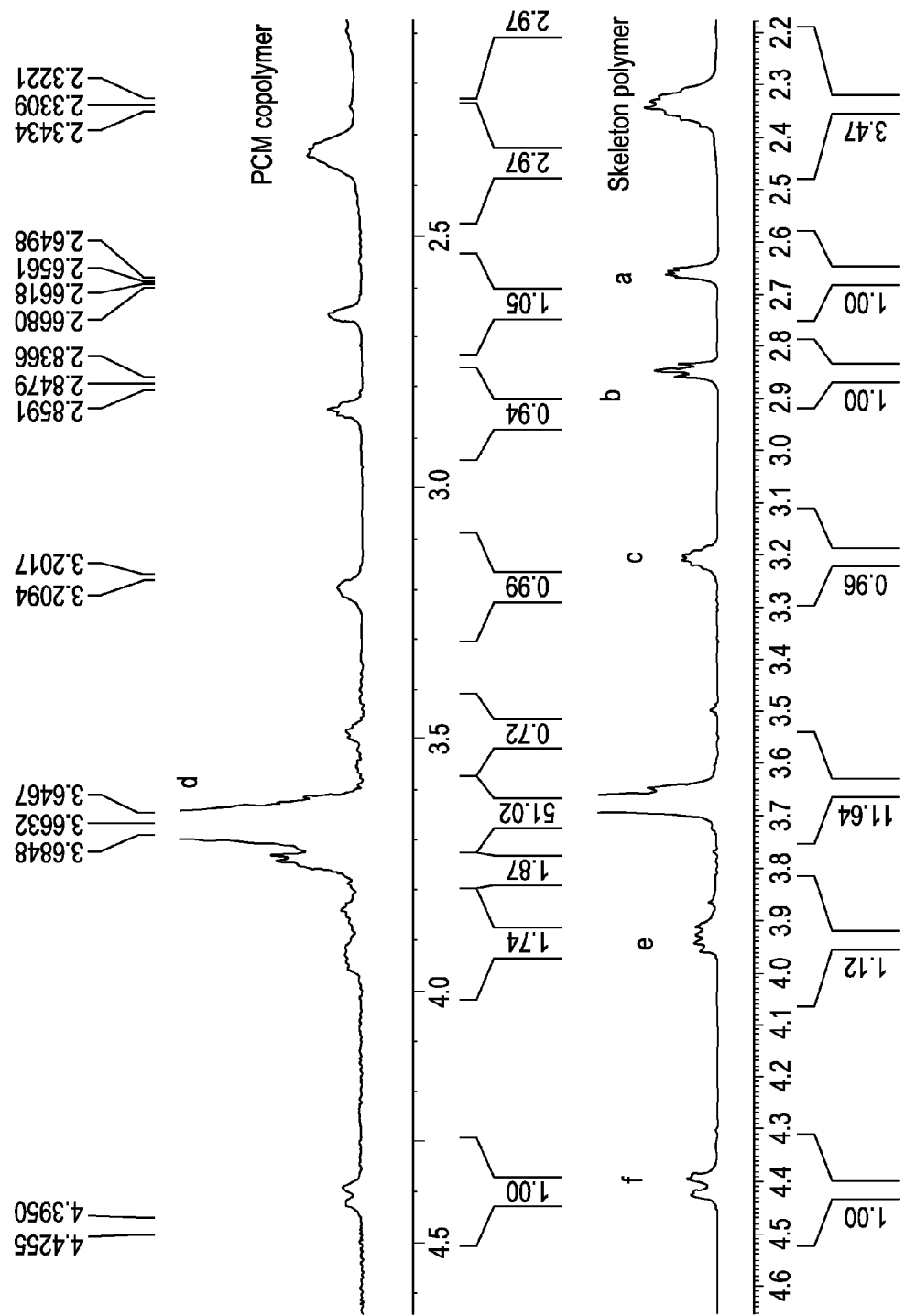

As can be seen in the NMR spectra depicted in FIG. 1, a peak belonging to PEG (d, 3.6~3.7) appears in the solid/solid PCM copolymer. Even though there is a peak belonging to skeleton polymer in this chemical shift, the obvious increase of intensity of this peak proves the existence of PEG in the PCM copolymer. From the IR testing, new peaks at 3500 cm-1 (hydroxyl group) and 1100 cm-1 (ether group) belonging to PEG appear in the spectra of PCM copolymer. Both of these measurements prove the successful grafting of PEG onto skeleton polymer.

Figure 2A:
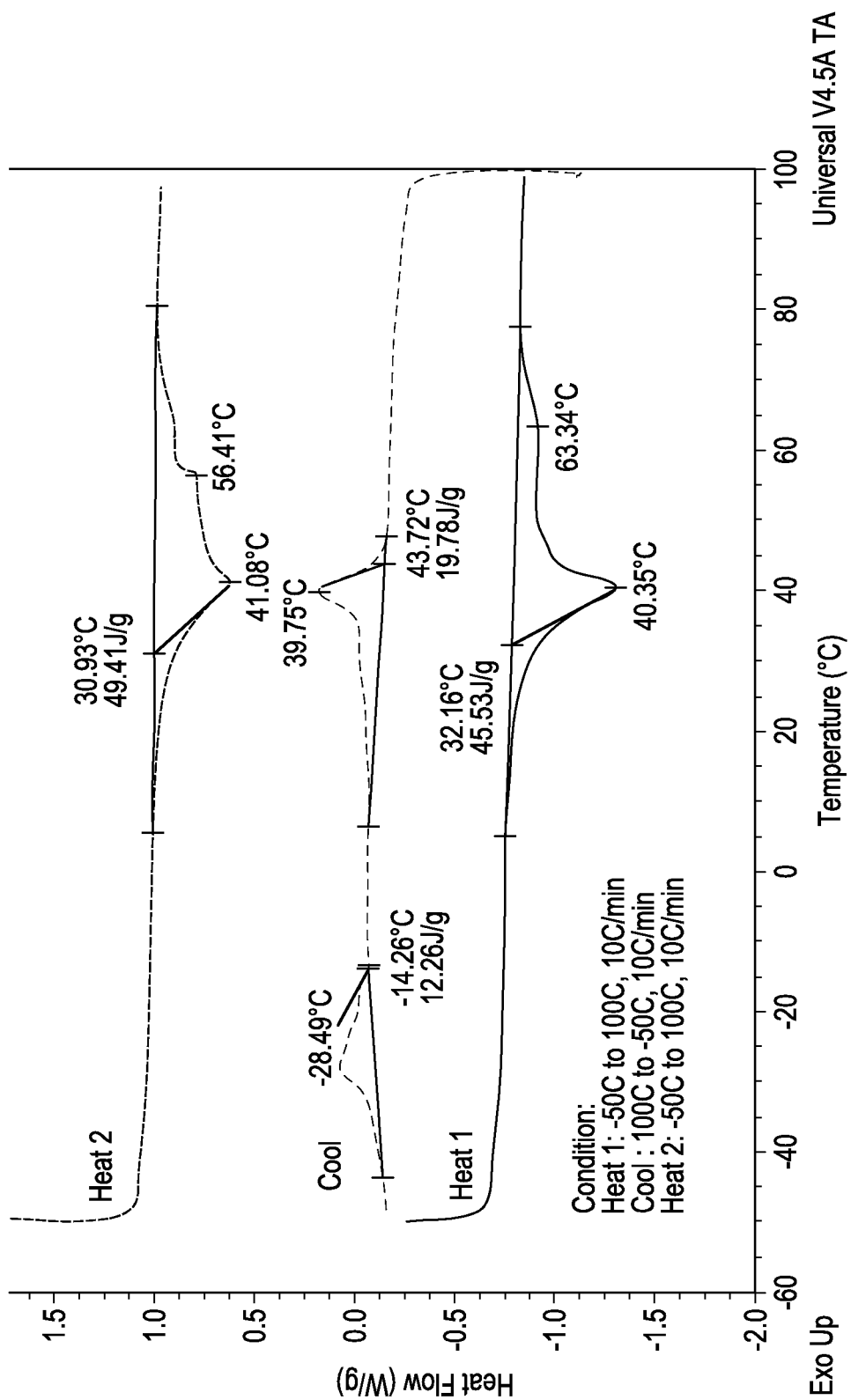
FIGS. 2A and 2B illustrate differential scanning calorimetry (DSC) analysis of a solid/solid PCM of the present invention.
Figure 2B:
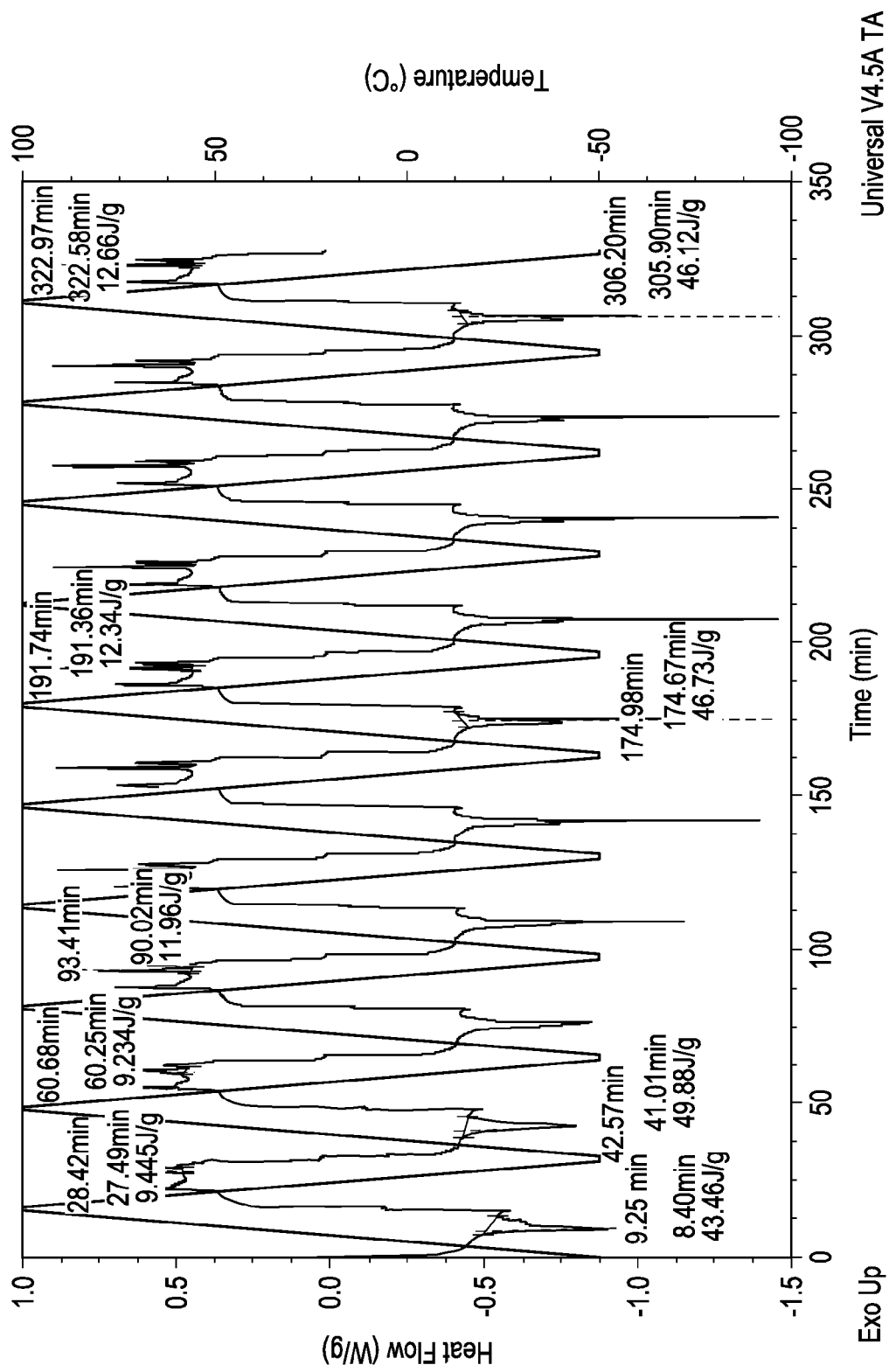

Thermal properties of PCM copolymer have been tested. From the DSC curves shown in FIG. 2A and FIG. 2B, the phase change temperature covers from 40~70° C., and the latent heat of phase change is about 50 kJ/kg. In addition, the latent heat copolymer is stable under ten times cycle.

According to a visual comparison of solid/solid PCM under room temperature and elevated temperature above phase change temperature, the films of solid/solid PCM copolymer remain in solid state. Thus, it is demonstrated that the PCM copolymer performs a solid/solid phase change.

Figure 3:
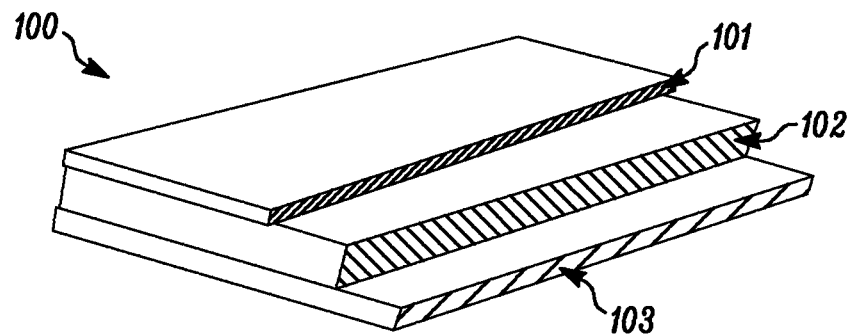
FIG. 3 illustrates one example of a three layer composite backsheet of the present invention.

As such, a solid/solid PCM in accordance with the present invention could be incorporated into a backsheet of a photovoltaic module, or otherwise used with the photovoltaic module, without experiencing the dimensional stability issues experienced by the prior art. For example, a backsheet can have any suitable number of layers, including for example, the three-layer structure illustrated in FIG. 3. As shown in FIG. 1, a backsheet 100 includes a first exterior layer 101, an interior layer 102, and a second exterior layer 103. The backsheet 100 can be made utilizing any suitable equipment, including, for example, a laminator or an extruder. Layers can be sized based on the needs of a particular application. More preferably, a solid/solid PCM of the present invention is co-extruded with other layers to form a backsheet. Even more preferably, and advantageously, a polyolefin unit in a solid/solid PCM of the present invention ensures compatibility with other polyolefins in the backsheet. Most preferably, at least some solid/solid PCM is incorporated in an exterior layer of a backsheet, or is otherwise configured to be directly in contact with the encapsulant for an electricity generating portion of a photovoltaic module, so as to readily scavenge and remove heat from that electricity generating portion.

Preferably, polyolefins and their copolymers with reactive groups are used as skeleton polymers in the present invention. The polyolefin includes polyethylene (PE), polypropylene (PP), poly-1-butene, poly-4-methyl-1-pentene, ethylene-propylene copolymer, ethylene-propylene-diene terpolymer and mixtures thereof. Examples of reactive groups include epoxide, glycidyl, carboxylic acid, anhydride, hydroxyl, etc.

Preferably, crystallizable side chains used in accordance with the present invention are compounds which have at least one reactive group in the molecule. Examples of reactive groups include hydroxyl, carboxylic acid, amine, acyl chloride, etc. Examples of crystallizable side chains include: polyethers with hydroxyl end groups (e.g., poly(ethylene glycol) (PEG) with molecular weight (MW) from 1,000 to 100,000, poly(ethylene oxide) (PEO) with MW from 100,000 to 1,000,000, poly(propylene glycol), poly(tetrahydrofuran glycol), etc.), fatty alcohols (e.g., lauryl alcohol ($C_{12}H_{26}O$); myristyl alcohol ($C_{14}H_{29}OH$); cetyl alcohol ($C_{16}H_{33}OH$); stearyl alcohol ($C_{18}H_{37}OH$); arachidyl alcohol ($C_{20}H_{41}OH$), etc.); fatty acids (lauric acid($C_{11}H_{23}COOH$), myristic acid ($C_{13}H_{27}COOH$), palmitic acid ($C_{15}H_{31}COOH$), stearic acid ($C_{17}H_{35}COOH$), etc.); and fatty amines (e.g., tetradecylamine ($C_{14}H_{29}NH_2$), hexadecylamine ($C_{16}H_{33}NH_2$), octadecylamine ($C_{18}H_{37}NH_2$), etc.).

Preferably, skeleton polymers and crystallizable side chains are selected such that a solid/solid PCM in accordance with the present invention experiences a phase change at a temperature of between about 25° C. and about 75° C. Even more preferably, the solid/solid PCM in accordance with the present invention experiences a phase change at a temperature of between about 35° C. and about 70° C. Most preferably, the solid/solid PCM in accordance with the present invention experiences a phase change at a temperature of between about 35° C. and about 60° C.

Preferred solid/solid PCMs in accordance with the present invention have a latent heat of phase change of at least 40 kJ/kg. Even more preferably, a solid/solid PCM in accordance with the present invention has a latent heat of phase change of at least 50 kJ/kg.

As described earlier, one preferred solid/solid PCM for use in a photovoltaic module of the present invention comprises a copolymeric backbone having a polyolefin repeating unit (i.e., polyethylene) and a crystallizable side chain (e.g., PEG). In the alternative, in accordance with the present invention, a solid/solid PCM having a polyolefin backbone which is not copolymeric, e.g., polypropylene, may be used in a photovoltaic module, provided that the solid/solid PCM experiences a phase change at a temperature of between about 25° C. and about 75° C. Such a graft copolymer based on chlorinated polypropylene and PEG was prepared as follows:

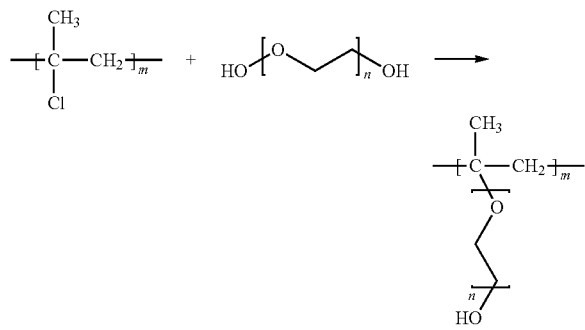

6 grams of chlorinated polypropylene (CPP) and 200 grams of PEG (MW=4000) were dissolved in toluene (200 ml) in a flask equipped with mechanical stirrer, condenser and nitrogen inlet. NaOH (4.4 g) was added into the flask as a catalyst. The solution was stirred under 120° C. for about 4-5 hours. The solution was then poured into 1 liter of methanol after the solution cooled down to room temperature. A precipitate was filtered from the mixed solution, and then was washed with methanol and water successively. Pale yellow powder was obtained after being dried in a vacuum oven.

Figure 4:
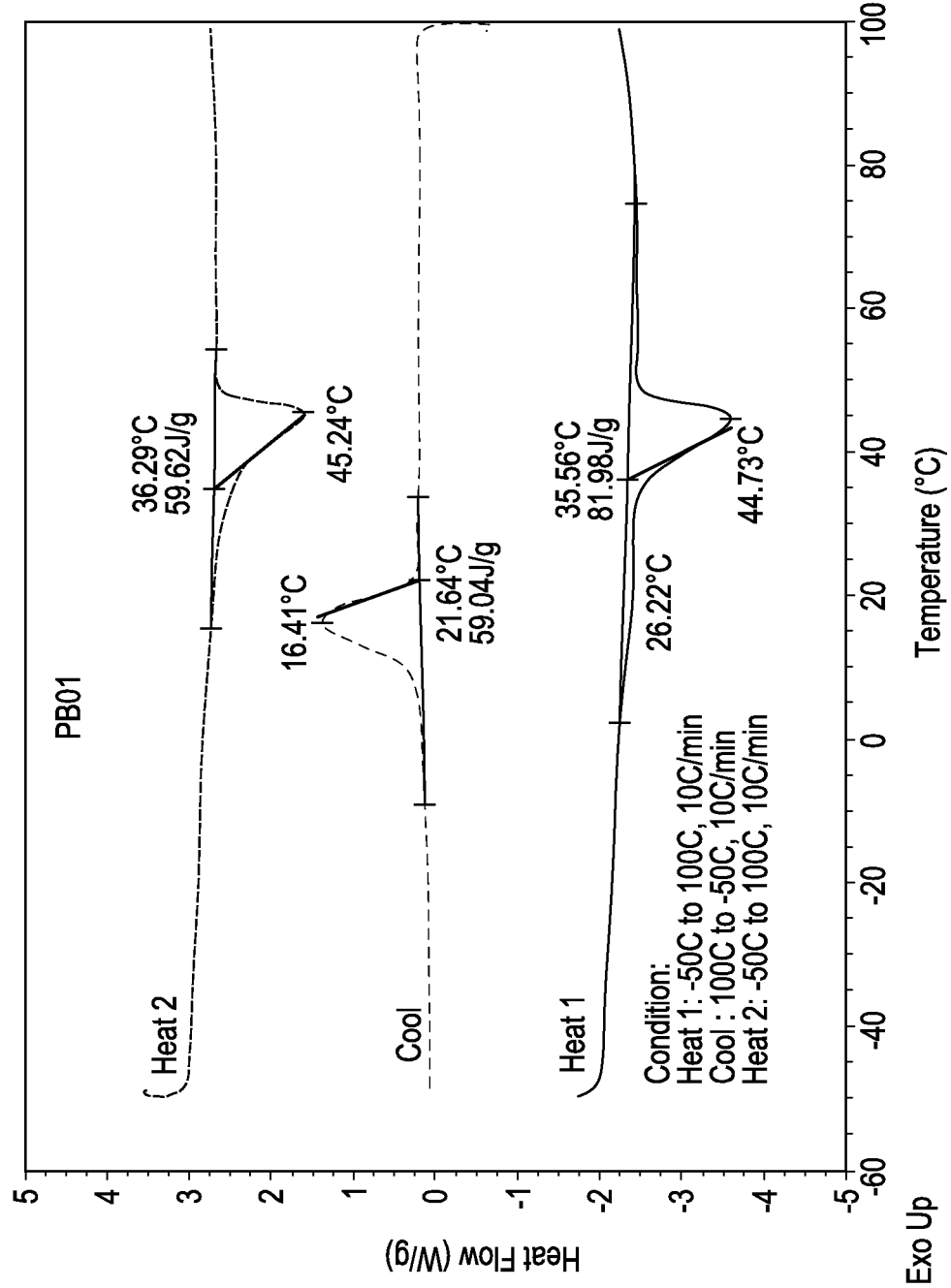
FIG. 4 illustrates differential scanning calorimetry (DSC) analysis of a second solid/solid PCM which may be used in a photovoltaic module of the present invention.

As shown in DSC testing depicted in FIG. 4, the graft copolymer has a solid to solid phase change at around 40-50° C., and the latent heat of phase change is about 60-80 kJ/kg.

From the foregoing, it will be appreciated that although specific examples have been described herein for purposes of illustration, various modifications may be made without deviating from the spirit or scope of this disclosure. It is therefore intended that the foregoing detailed description be regarded as illustrative rather than limiting, and that it be understood that it is the following claims, including all equivalents, that are intended to particularly point out and distinctly claim the claimed subject matter.

What is claimed is:

1. A solid/solid phase change material comprising:
   a poly(ethylene-co-glycidyl methacrylate) backbone copolymer; and,
   a crystallizable side chain of a polyethylene glycol grafted onto the backbone copolymer by the reaction between epoxide of the glycidyl methacrylate and a hydroxyl group of the crystallizable side chain,
   wherein the solid/solid phase change material experiences a phase change at a temperature in the range of from about 30° C. to about 75° C.

2. The solid/solid phase change material of claim 1, wherein the polyethylene glycol has a molecular weight of about 4000.

3. The solid/solid phase change material of claim 1, wherein the solid/solid phase change material experiences a phase change at a temperature in the range of from about 40° C. to about 70° C.

4. The solid/solid phase change material of claim 1, wherein the solid/solid phase change material has a latent heat of phase change of at least 40 kJ/kg.

5. A backsheet for a photovoltaic module comprising a solid/solid phase change material comprising:
   a poly(ethylene-co-glycidyl methacrylate) backbone copolymer; and
   a crystallizable side chain of a polyethylene glycol grafted onto the backbone copolymer by the reaction between epoxide of the glycidyl methacrylate and a hydroxyl group of the crystallizable side chain.

* * * * *